US012568842B2

(12) United States Patent
Zhou et al.

(10) Patent No.: US 12,568,842 B2
(45) Date of Patent: Mar. 3, 2026

(54) HIGHLY INTEGRATED POWER ELECTRONICS AND METHODS OF MANUFACTURING THE SAME

(71) Applicant: Toyota Motor Engineering & Manufacturing North America, Inc., Plano, TX (US)

(72) Inventors: Feng Zhou, Ann Arbor, MI (US); Tianzhu Fan, Houston, TX (US); Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 320 days.

(21) Appl. No.: 18/115,359

(22) Filed: Feb. 28, 2023

(65) Prior Publication Data

US 2024/0290632 A1    Aug. 29, 2024

(51) Int. Cl.
| | |
|---|---|
| *H05K 3/00* | (2006.01) |
| *H01L 21/56* | (2006.01) |
| *H01L 23/46* | (2006.01) |
| *H01L 25/00* | (2006.01) |
| *H05K 7/20* | (2006.01) |
| *H01L 23/31* | (2006.01) |
| *H01L 23/498* | (2006.01) |
| *H01L 25/07* | (2006.01) |

(52) U.S. Cl.
CPC ............ *H01L 21/561* (2013.01); *H01L 23/46* (2013.01); *H01L 25/50* (2013.01); *H05K 3/0052* (2013.01); *H05K 3/0061* (2013.01);

*H05K 7/2089* (2013.01); *H01L 23/3121* (2013.01); *H01L 23/49822* (2013.01); *H01L 25/072* (2013.01)

(58) Field of Classification Search
None
See application file for complete search history.

(56) References Cited

U.S. PATENT DOCUMENTS

| | | | |
|---|---|---|---|
| 2014/0355218 A1* | 12/2014 | Vinciarelli | ............. H05K 5/065 |
| | | | 361/728 |
| 2020/0212018 A1 | 7/2020 | Lai et al. | |
| 2021/0159217 A1 | 5/2021 | Yu et al. | |
| 2022/0013431 A1 | 1/2022 | Zhou et al. | |
| 2022/0022323 A1 | 1/2022 | Zhou et al. | |
| 2022/0053634 A1 | 2/2022 | Zhou et al. | |

(Continued)

*Primary Examiner* — Jay C Chang
(74) *Attorney, Agent, or Firm* — Christopher G. Darrow; DARROW MUSTAFA PC

(57) ABSTRACT

A method for high volume manufacture of highly integrated power electronics embedded printed circuit board (PCB)—cold plate assemblies or units includes assembling an integrated power electronics embedded PCB fabrication panel onto a cold plate fabrication panel and forming an integrated power electronics embedded PCB—cold plate fabrication panel. The integrated power electronics embedded PCB—cold plate fabrication panel is cut into a plurality of highly integrated power electronics embedded PCB—cold plate assemblies such that the plurality of highly integrated power electronics embedded PCB—cold plate assemblies individually include an integrated power electronics embedded PCB attached to and in thermal communication with a cold plate. Also, the cold plate can include a fluid chamber configured for a cooling fluid to flow therethrough.

20 Claims, 11 Drawing Sheets

(56) References Cited

U.S. PATENT DOCUMENTS

| 2022/0141951 A1 | 5/2022 | Zhou et al. |
| 2022/0157693 A1 | 5/2022 | Zhou et al. |
| 2024/0249998 A1* | 7/2024 | Gao ........................ H01L 24/08 |

* cited by examiner

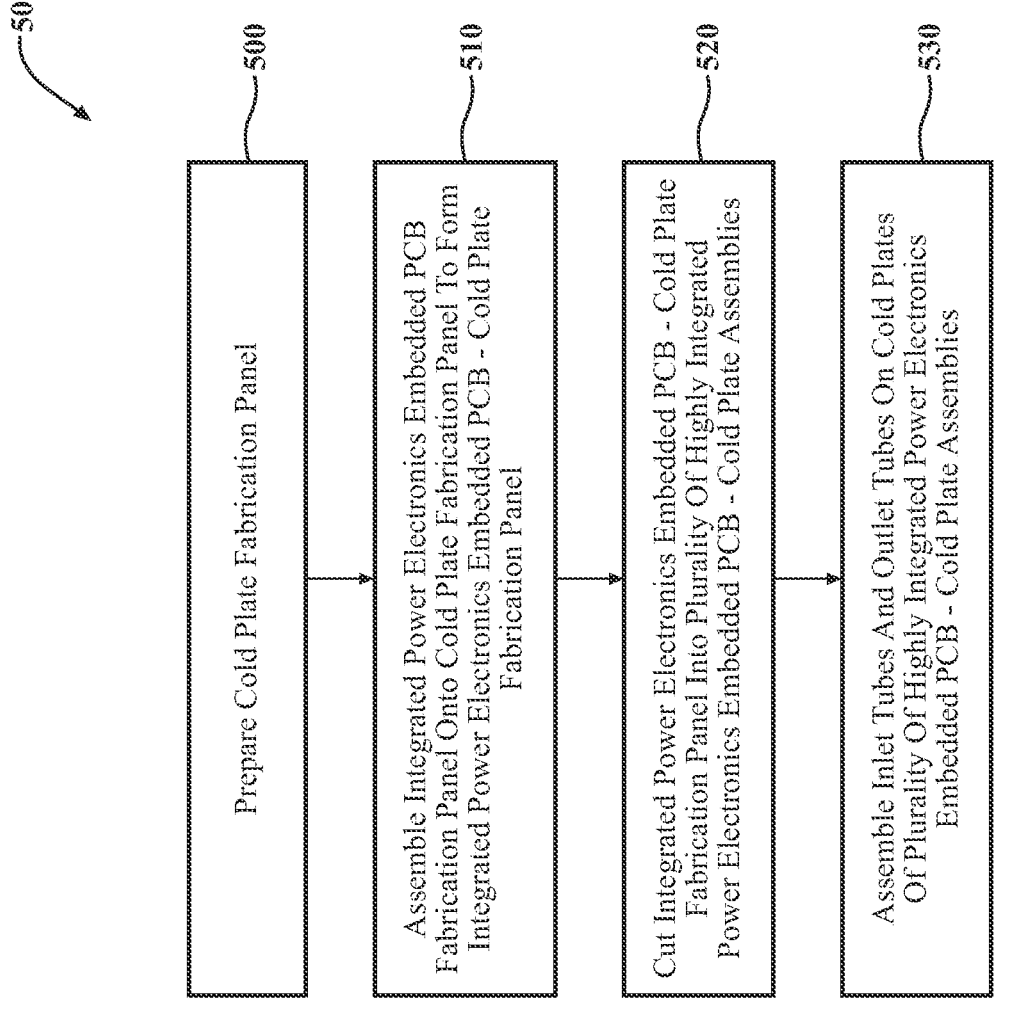

500 Prepare Cold Plate Fabrication Panel

510 Assemble Integrated Power Electronics Embedded PCB Fabrication Panel Onto Cold Plate Fabrication Panel To Form Integrated Power Electronics Embedded PCB - Cold Plate Fabrication Panel 520 Cut Integrated Power Electronics Embedded PCB - Cold Plate Fabrication Panel Into Plurality Of Highly Integrated Power Electronics Embedded PCB - Cold Plate Assemblies 530 Assemble Inlet Tubes And Outlet Tubes On Cold Plates Of Plurality Of Highly Integrated Power Electronics Embedded PCB - Cold Plate Assemblies

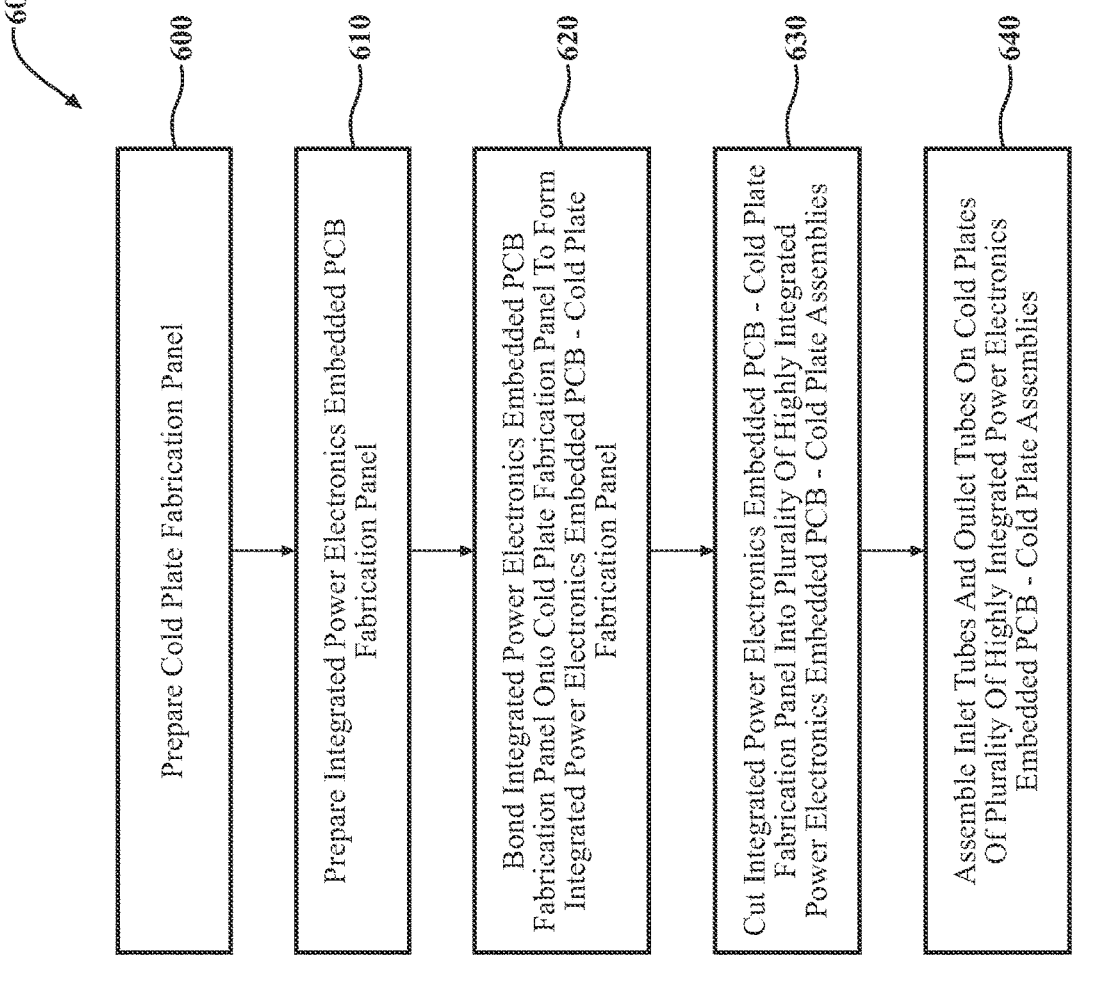

60

600

Prepare Cold Plate Fabrication Panel

610

Prepare Integrated Power Electronics Embedded PCB Fabrication Panel

620

Bond Integrated Power Electronics Embedded PCB Fabrication Panel Onto Cold Plate Fabrication Panel To Form Integrated Power Electronics Embedded PCB - Cold Plate Fabrication Panel

630

Cut Integrated Power Electronics Embedded PCB - Cold Plate Fabrication Panel Into Plurality Of Highly Integrated Power Electronics Embedded PCB - Cold Plate Assemblies

640

Assemble Inlet Tubes And Outlet Tubes On Cold Plates Of Plurality Of Highly Integrated Power Electronics Embedded PCB - Cold Plate Assemblies

FIG. 6

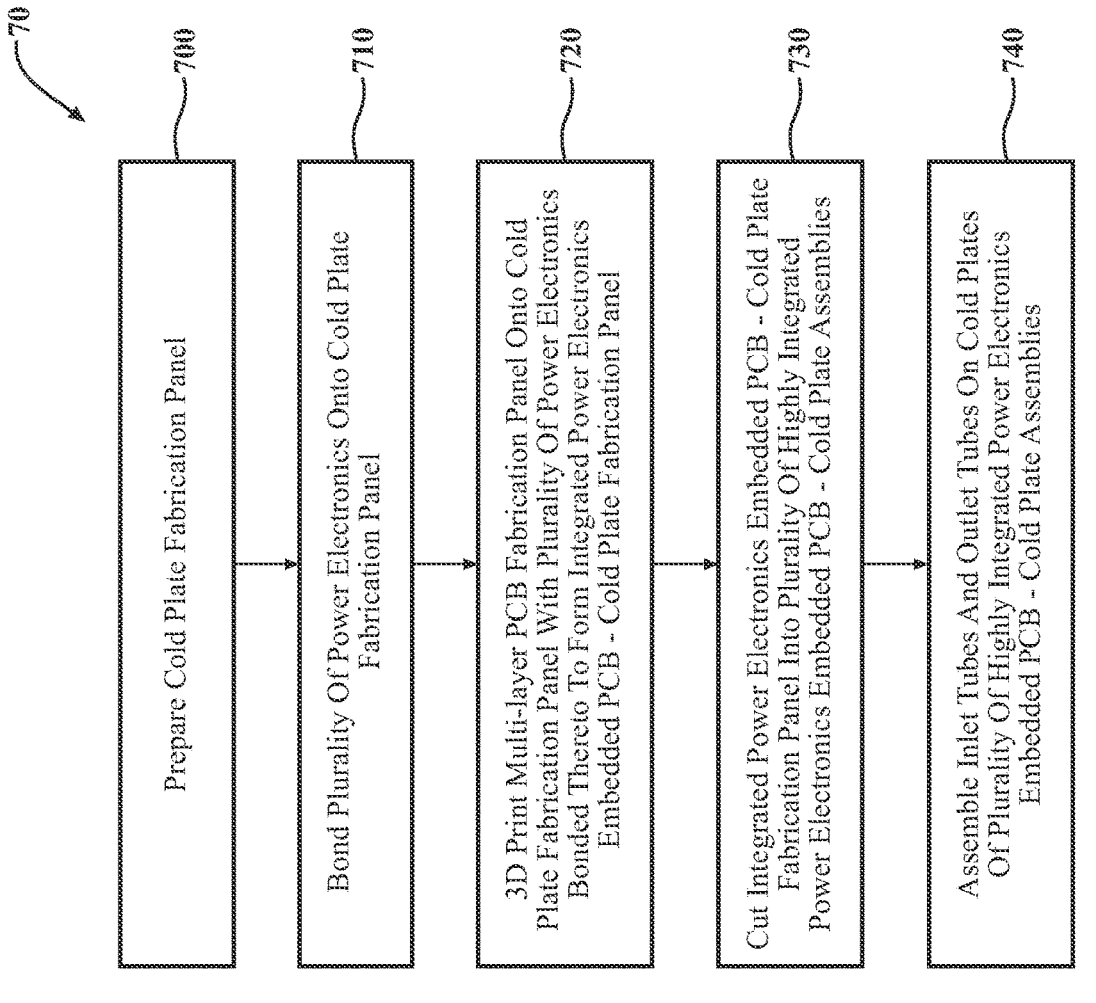

700 — Prepare Cold Plate Fabrication Panel

710 — Bond Plurality Of Power Electronics Onto Cold Plate Fabrication Panel

720 — 3D Print Multi-layer PCB Fabrication Panel Onto Cold Plate Fabrication Panel With Plurality Of Power Electronics Bonded Thereto To Form Integrated Power Electronics Embedded PCB - Cold Plate Fabrication Panel 730 — Cut Integrated Power Electronics Embedded PCB - Cold Plate Fabrication Panel Into Plurality Of Highly Integrated Power Electronics Embedded PCB - Cold Plate Assemblies 740 — Assemble Inlet Tubes And Outlet Tubes On Cold Plates Of Plurality Of Highly Integrated Power Electronics Embedded PCB - Cold Plate Assemblies

HIGHLY INTEGRATED POWER ELECTRONICS AND METHODS OF MANUFACTURING THE SAME

TECHNICAL FIELD

The present disclosure relates to integrated power electronics, and particularly to printed circuit boards with power devices embedded therein.

BACKGROUND

Printed circuit boards (PCBs) are typically used for mechanical support and electrical connection of electronic components using conductive pathways of copper sheets laminated onto a non-conductive substrate. And multi-layer PCBs provide higher capacity and/or density of electronic components in a smaller footprint by incorporating two or more layers. However, the design and/or manufacture of multilayer PCBs can be difficult.

The present disclosure addresses issues related to the manufacture of multi-layer PCBs and other issues related to multi-layer PCBs.

SUMMARY

This section provides a general summary of the disclosure and is not a comprehensive disclosure of its full scope or all of its features.

In one form of the present disclosure, a method includes assembling an integrated power electronics embedded printed circuit board (PCB) fabrication panel onto a cold plate fabrication panel and forming an integrated power electronics embedded PCB—cold plate fabrication panel, and cutting the integrated power electronics embedded PCB—cold plate fabrication panel into a plurality of highly integrated power electronics embedded PCB—cold plate assemblies such that the plurality of highly integrated power electronics embedded PCB—cold plate assemblies individually include an integrated power electronics embedded PCB attached to and in thermal communication with a cold plate.

In another form of the present disclosure, a method includes assembling an integrated power electronics embedded PCB fabrication panel onto a cold plate fabrication panel and forming an integrated power electronics embedded PCB—cold plate fabrication panel via laminating an integrated power electronics embedded PCB onto a cold plate fabrication panel, and cutting the integrated power electronics embedded PCB—cold plate fabrication panel into a plurality of highly integrated power electronics embedded PCB—cold plate assemblies such that the plurality of highly integrated power electronics embedded PCB—cold plate assemblies individually include an integrated power electronics embedded PCB attached to and in thermal communication with a cold plate comprising a fluid chamber configured for a cooling fluid to flow therethrough.

In still another form of the present disclosure, a method includes assembling an integrated power electronics embedded PCB fabrication panel onto a cold plate fabrication panel and forming an integrated power electronics embedded PCB—cold plate fabrication panel via laminating an integrated power electronics embedded PCB onto a cold plate fabrication panel, and cutting the integrated power electronics embedded PCB—cold plate fabrication panel into a plurality of highly integrated power electronics embedded PCB—cold plate assemblies such that the plurality of highly integrated power electronics embedded PCB—cold plate assemblies individually include an integrated power electronics embedded PCB attached to and in thermal communication with a cold plate comprising a fluid chamber configured for a cooling fluid to flow therethrough.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein:

FIG. 5 shows a flow chart for a method of manufacturing a plurality of highly integrated power electronics embedded PCB—cold plate assemblies according to one form of the present disclosure;

FIG. 6 shows a flow chart for a method of manufacturing a plurality of highly integrated power electronics embedded PCB—cold plate assemblies according to another form of the present disclosure; and FIG. 7 shows a flow chart for a method of manufacturing a plurality of highly integrated power electronics embedded PCB—cold plate assemblies according to still another form of the present disclosure.

It should be noted that the figures set forth herein are intended to exemplify the general characteristics of the methods, devices, and systems among those of the present technology, for the purpose of the description of certain aspects. The figures may not precisely reflect the characteristics of any given aspect and are not necessarily intended to define or limit specific forms or variations within the scope of this technology.

DETAILED DESCRIPTION

The present disclosure provides highly integrated power electronics embedded PCB—cold plate assemblies and methods of manufacturing highly integrated power electronics embedded PCB—cold plate assemblies. As used herein, the phrase "highly integrated power electronics embedded PCB" refers to a single multi-layer PCB module or unit with two or more power semiconductor devices (also referred to herein simply as "power device" or "power devices"), control/drive/protection electronic circuitry, and passive components, embedded therein. Also, as used herein, the phrase "power device" refers to a semiconductor device used as a switch or rectifier in power electronics and single multi-layer PCB module or unit with two or more power semiconductor devices embedded at least partially therein is referred to herein as an "integrated power electronics embedded PCB."

The highly integrated power electronics embedded PCB—cold plate assemblies each include a cold plate with an integrated power electronics PCB bonded to and in thermal communication with the cold plate. The cold plate can be fluid cooled, i.e., a cooling fluid can flow through the cold plate, such that temperatures of the one or more power devices during operation remain below a predefined temperature. In addition, the integrated power electronics PCB is electrically isolated from the cold plate via a low thermal resistance (LTR) dielectric layer, a CVD dielectric layer, a ceramic sintered layer, and/or a 3D printed dielectric layer.

Figures 1A, 1B:
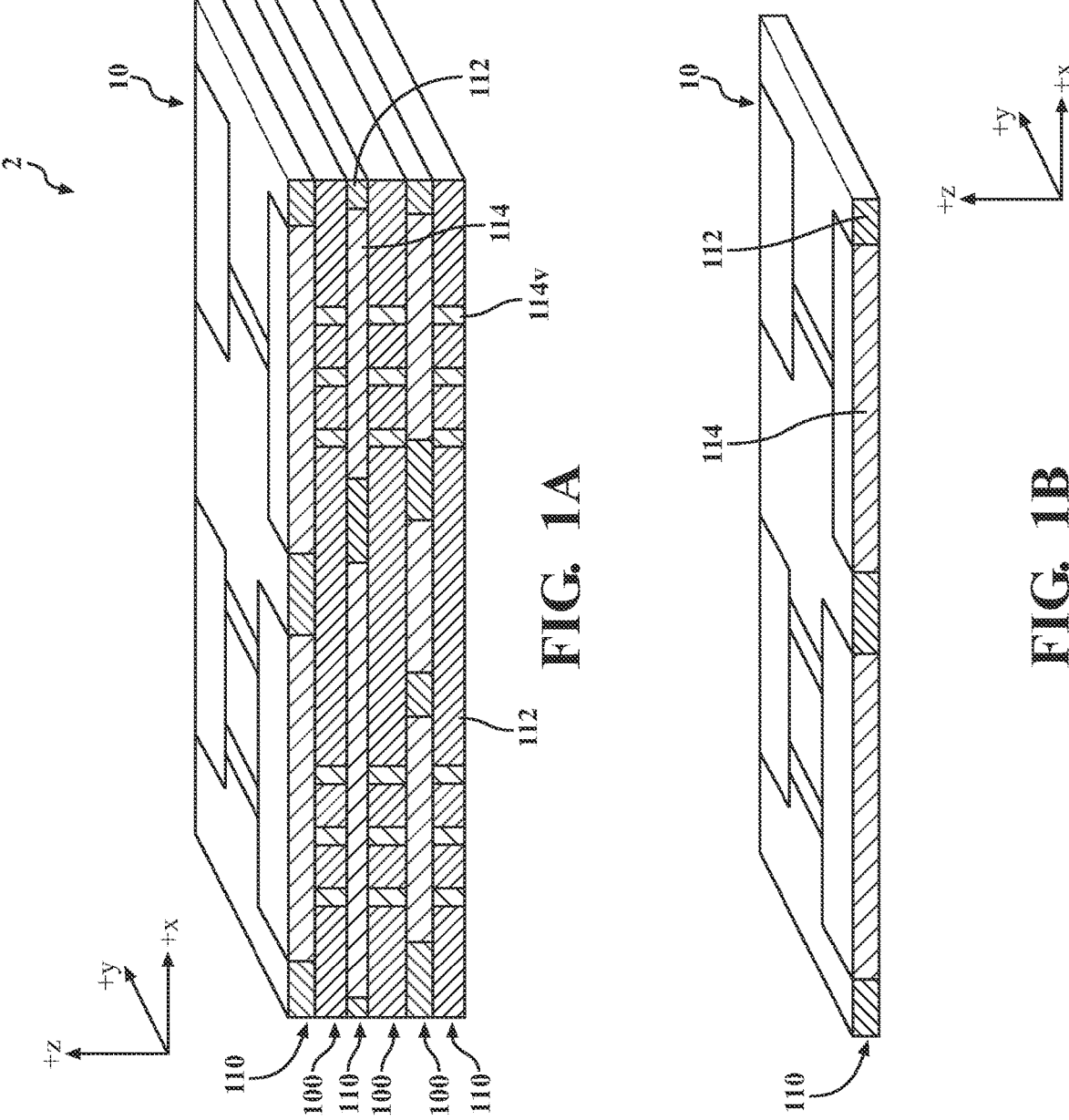
FIG. 1A shows a perspective view of a multi-layer PCB for a highly integrated power electronics embedded PCB—cold plate assembly according to the teachings of the present disclosure.
FIG. 1B shows a perspective for a power layer of the multi-layer PCB in FIG. 1A.

Referring now to FIGS. 1A-1B, a perspective cross-sectional view of a multi-layer PCB 10 is shown in FIG. 1A and an isolated perspective cross-sectional view of a power layer 110 of the multi-layer PCB 10 is shown in FIG. 1B. The multi-layer PCB 10 includes a plurality of dielectric layers 100 and a plurality of the power layers 110. The power layers 110 include a dielectric material 112 and a conductive material 114. The dielectric layers 100 include the dielectric material 112 and conductive vias 114v that provide electrical communication or pathways between adjacent power layers 110. Stated differently, the power layers 110 include conductive (e.g., copper) patterns and the dielectric layers 100 include conductive (e.g., copper) pathways that connect the conductive patterns 114 such that the multi-layer PCB 10 functions and/or operates as desired.

In some variations, the power layers 110 are formed from a glass reinforced epoxy laminate dielectric material (e.g., FR-4), or other dielectric material, with the conductive material 114 embedded therein. In other variations, the power layers 110 are 3D printed using a dielectric material ink to form the dielectric material 112, with the conductive material 114 embedded therein. And in at least one variation, the conductive material 114 is also 3D printed with a conductive material ink. Non limiting examples of dielectric material inks are inks that include UV-curable dielectric materials such as UV-curable acrylated monomer selected from one or more of an acrylate epoxy, an acrylate polyester, an acrylate urethane, and an acrylate silicone, among others. And non-limiting examples of conductive material inks are inks that include silver nanoparticles and/or graphene nanosheets, among others. It should be understood that the dielectric layers 100 can also be formed from a glass reinforced epoxy laminate dielectric material (e.g., FR-4), or other dielectric material, or 3D printed using a dielectric material ink.

The dielectric layers 100 and the power layers 110 have a predefined average thickness (z-direction). For example, in some variations, the predefined average thickness is between about 50 micrometers ($\mu$m) and about 250 $\mu$m, for example, between about 75 $\mu$m and about 200 $\mu$m. And in at least one variation, the predefined thickness is between about 75 $\mu$m and about 150 $\mu$m, for example, between about 80 $\mu$m and about 120 $\mu$m.

Figure 2:
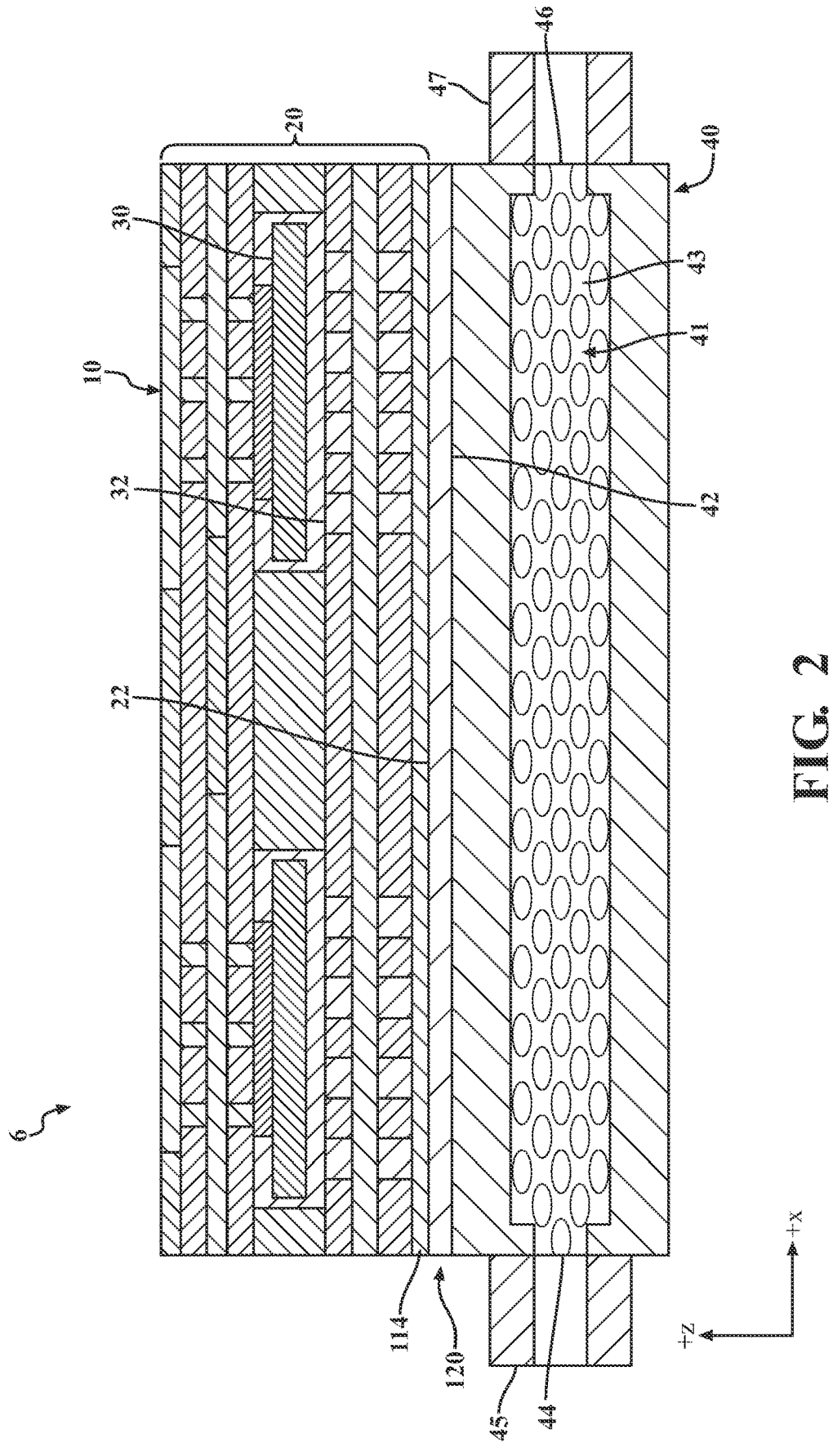
FIG. 2 shows a side view of a highly integrated power electronics embedded PCB—cold plate assembly according to the teachings of the present disclosure.

Referring to FIG. 2, a side view of a highly integrated power electronics embedded PCB—cold plate assembly 2 according to one form of the present disclosure is shown. The highly integrated power electronics embedded PCB—cold plate assembly 2 includes a power electronics embedded PCB 20 formed from the multi-layer PCB 10 with power devices 30 embedded therein, and a cold plate 40. In some variations, the power devices 30 are totally embedded in the multi-layer PCB 10, i.e., one or more dielectric layers 100 and/or one or more power layers 110 are above (+z direction) the power devices 30, and one or more dielectric layers 100 and/or one or more power layers 110 are below (−z direction) the power devices 30. In other variations, the power devices 30 form at least a portion of a lower surface 22 of the power electronics embedded PCB 20. That is, a lower surface 32 of one or more power devices 30 is aligned or coplanar with the lower surface 22 of the power electronics embedded PCB 20 (not shown) such that the lower surfaces 22, 32 of the power electronics embedded PCB 20 and power device(s), respectively, are bonded to the cold plate via a bonding interface 120. As used herein, the phrase "bonding interface" refers to one or more layers disposed between a multi-layer PCB and/or a power electronics embedded PCB bonded to a cold plate.

The power electronics embedded PCB 20 is bonded to the cold plate 40 such that the power devices 30 are in thermal communication with the cold plate 40. Accordingly, and during operation of the highly integrated power electronics embedded PCB—cold plate assembly 2, the power devices 30 are cooled via the flow of heat from the power devices 30 to the cold plate 40. In some variations, the cold plate 40 includes an internal fluid chamber 41 with an inlet 44, an outlet 46, and fins, porous material, mesh-structured, machined or cast heat sinks 43 disposed within the fluid chamber 41. In addition, an inlet tube 45 can be attached to and in fluid communication with the inlet 44 and/or an outlet tube 47 can be attached to and in fluid communication with the outlet 46. Also, at least one variation the cold plate 40 is formed form an electrically conductive material (e.g., aluminum) and it is desirable that a bonding interface 120 between the power electronics embedded PCB 20 and the cold plate 40 exhibit desired electrical insulation and thermal conduction properties.

Still referring to FIG. 2, the bonding interface 120 is disposed between the cold plate 40 and the power electronics embedded PCB 20. In some variations, the bonding interface 120 includes a LTR dielectric layer disposed between a power electronics embedded PCB bonded to a cold plate. In other variations, the bonding interface 120 includes a CVD dielectric layer disposed between a power electronics embedded PCB bonded to a cold plate. In still other variations, the bonding interface 120 includes a ceramic sintered layer disposed between a power electronics embedded PCB bonded to a cold plate. And in at least one variation the bonding interface 120 is one or more 3D printed layers disposed between a power electronics embedded PCB bonded to a cold plate. As used herein, the phrase "CVD dielectric layer" refers to a dielectric layer that has been formed on a surface using chemical vapor deposition (CVD).

In some variations, the bonding interface 120 is disposed between an upper (+z direction) surface 42 of the cold plate 40 and a lower (−z direction) surface 22 of the power electronics embedded PCB 20. For example, in some variations, the bonding interface 120 is bonded directly to the upper surface 42 of the cold plate 40, i.e., the bonding interface 120 is in direct contact with the upper surface 42. In at least one variation, the bonding interface 120 is bonded directly to the lower surface 22 of the power electronics embedded PCB 20. And in some variations, the bonding interface 120 is bonded directly to the upper surface 42 of the cold plate 40 and the lower surface 22 of the power electronics embedded PCB 20. As used herein, the phrase "directly bonded" refers to one component or layer being bonded to and in direct contact with another component or layer, i.e., without any additional components or layers therebetween.

In variations where the bonding interface 120 is a LTR dielectric layer, the LTR dielectric layer can be formed from any dielectric material and/or dielectric composite material suitable to electrically isolate the power electronics embedded PCB 20 from the cold plate 40. In some variations, the LTR dielectric layer is a ceramic-polymer composite dielectric material such as $BaTiO_3$-polymer dielectric materials, $Pb(Zr_xTi_{1-x})O_3$-polymer dielectric materials ($0 \le x \le 1$), and/or $SrTiO_3$ dielectric materials, among others. Also, in some variations, the LTR dielectric layers according to the teachings of the present disclosure have an average thickness (z direction) less than about 250 μm, for example less than about 200 μm, less than about 150 μm, less than about 100 μm, less than about 50 μm, less than about 40 μm, less than about 30 μm, less than about 20 μm, or less than about 10 μm. In some variations the LTR dielectric layer has an average thickness between about 10 μm and about 50 μm, for example between about 20 μm and about 40 μm, or between about 25 μm and about 35 μm.

In variations where the bonding interface 120 is CVD dielectric layer, the CVD dielectric layer can be formed or deposited directly on the upper surface 42 of the cold plate 40, and the bonding interface 120 can include a bonding layer in direct contact with and sandwiched between CVD dielectric layer and the lower surface 22 of the power electronics embedded PCB 20. In other variations, the CVD dielectric layer can be formed or deposited directly on the lower surface 22 of the power electronics embedded PCB 20, and the bonding interface 120 can include a bonding layer in direct contact with the upper surface 42 of the cold plate 40. The bonding layer can be formed from any bonding material suitable for electronic circuitry and/or semiconductor component fabrication including tin, lead free solders, bonding material used for transient liquid phase (TLP) bonding, and bonding material used for sintering, among others. Also, the bonding layer can have a thickness between about 50 μm and about 250 μm, for example, between about 50 μm and about 200 μm, between about 50 μm and about 150 μm, or between about 75 μm and about 125 μm.

In some variations, a thin (e.g., less than about 10 or 20 μm) metallization that enhances bonding between the bonding interface 120 and the power electronics embedded PCB 20 and/or the cold plate 40 is included. For example, in some variations the bonding interface 120 includes the CVD dielectric layer, the LTR dielectric layer, or the ceramic sintered layer, and in such variations a thin metallization layer can be present between the upper surface 42 of the cold plate 40 and the CVD dielectric layer, the LTR dielectric layer, or the ceramic sintered layer, and/or a thin metallization layer can be present between the lower surface 22 of the power electronics embedded PCB 20 and the CVD dielectric layer, the LTR dielectric layer, or the ceramic sintered layer. However, it should be understood that when the bonding interface 120 does not include an electrical insulation layer, e.g., when a copper conductive layer of a multi-layer PCB is bonded directly to a cold plate, a metallization layer may not be desired or present.

Figures 3A, 3B, 3C, 3D:
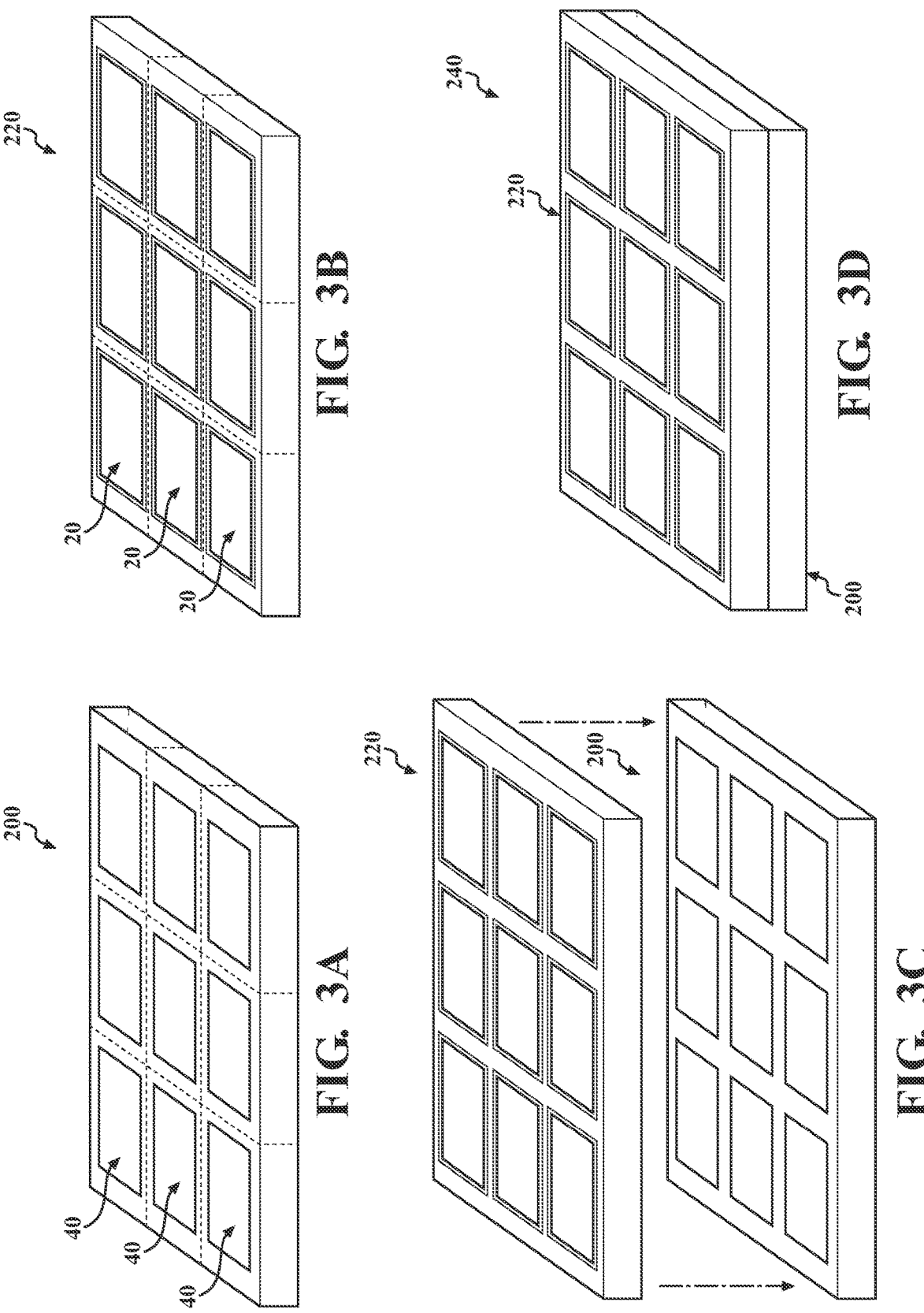
FIG. 3A shows a perspective view of a cold plate fabrication panel according to the teachings of the present disclosure.
FIG. 3B shows a perspective view of an integrated power electronics embedded PCB fabrication panel according to the teachings of the present disclosure.
FIG. 3C illustrates the integrated power electronics embedded PCB fabrication panel in FIG. 3B being bonded to the cold plate fabrication panel in FIG. 3A.
FIG. 3D shows a perspective view of a highly integrated power electronics embedded PCB—cold plate fabrication panel according to the teachings of the present disclosure.

Referring now to FIGS. 3A-3I, steps for manufacturing a plurality of highly integrated power electronics embedded PCB—cold plate assemblies 2 according to at least one form of the present disclosure are shown. For example, FIG. 3A illustrates preparing or providing a cold plate fabrication panel 200 from which nine (9) separate cold plates 40 are formed. That is, the cold plate fabrication panel 200 is manufactured to have nine individual cold plates 40 after the cold plate fabrication panel 200 is cut or separated into individual cold plates units as illustrated by the dotted lines in the figure. It should be understood that the cold plate fabrication panel 200 can be manufactured to have less than nine or more than nine individual cold plates 40 after the cold plate fabrication panel 200 is cut or separated into individual cold plates units.

FIG. 3B illustrates preparing or providing a power electronics embedded PCB fabrication panel 220 from which nine power electronics embedded PCBs 20 are formed. That is the power electronics embedded PCB fabrication panel 220 is manufactured to have nine individual power electronics embedded PCBs 20 after the power electronics embedded PCB fabrication panel 220 is cut or separated into individual power electronics embedded PCBs 20 as illustrated by the dotted lines in the figure. It should be understood that the power electronics embedded PCB fabrication panel 220 can be manufactured to have less than nine or more than nine individual power electronics embedded PCBs 20 after the power electronics embedded PCB fabrication panel 220 is cut or separated into individual cold plates units. However, it should also be understood that the power electronics embedded PCB fabrication panel 220 can generally have the same number of power electronics embedded PCBs 20 as the number of cold plates 40 within the cold plate fabrication panel 200.

FIG. 3C illustrates bonding the power electronics embedded PCB fabrication panel 220 to the cold plate fabrication panel 200 with the individual power electronics embedded PCBs 20 aligned (z direction) with the individual cold plates 40 such that a power electronics embedded PCB—cold plate fabrication panel 240 is formed as shown in FIG. 3D. The power electronics embedded PCB fabrication panel 220 can be bonded to the cold plate fabrication panel 200 using any bonding technique or process suitable for bonding a multi-layer PCB to a cold plate, including the techniques and processes disclosed herein. And as noted above, in some variations, the power electronics embedded PCB fabrication panel 220 is bonded to the cold plate fabrication panel 200 via a bonding interface 120 that includes a CVD dielectric layer, a LTR dielectric layer, or a ceramic sintered layer.

In some variations, the power electronics embedded PCB fabrication panel 220 is laminated to the cold plate fabrication panel 200 via the bonding interface 120, while in other variations the power electronics embedded PCB fabrication panel 220 is bonded to the cold plate fabrication panel 200 via the bonding interface 120 using heat (i.e., elevated temperature) and/or pressure (i.e., elevated pressure). For example, in some variations pressures between about 2.1 megapascals (MPa) (300 pounds per square inch (psi)) and about 2.8 MPa (400 psi) are applied to the power electronics embedded PCB fabrication panel 220 and the cold plate fabrication panel 200 (with the bonding interface 120 sandwiched therebetween). In the alternative, or in addition to, the power electronics embedded PCB fabrication panel 220 and the cold plate fabrication panel 200, with the bonding interface 120 sandwiched therebetween, are held at temperatures between about 150° C. (300° F.) and about 204° C. (400° F.).

Figure 3E:
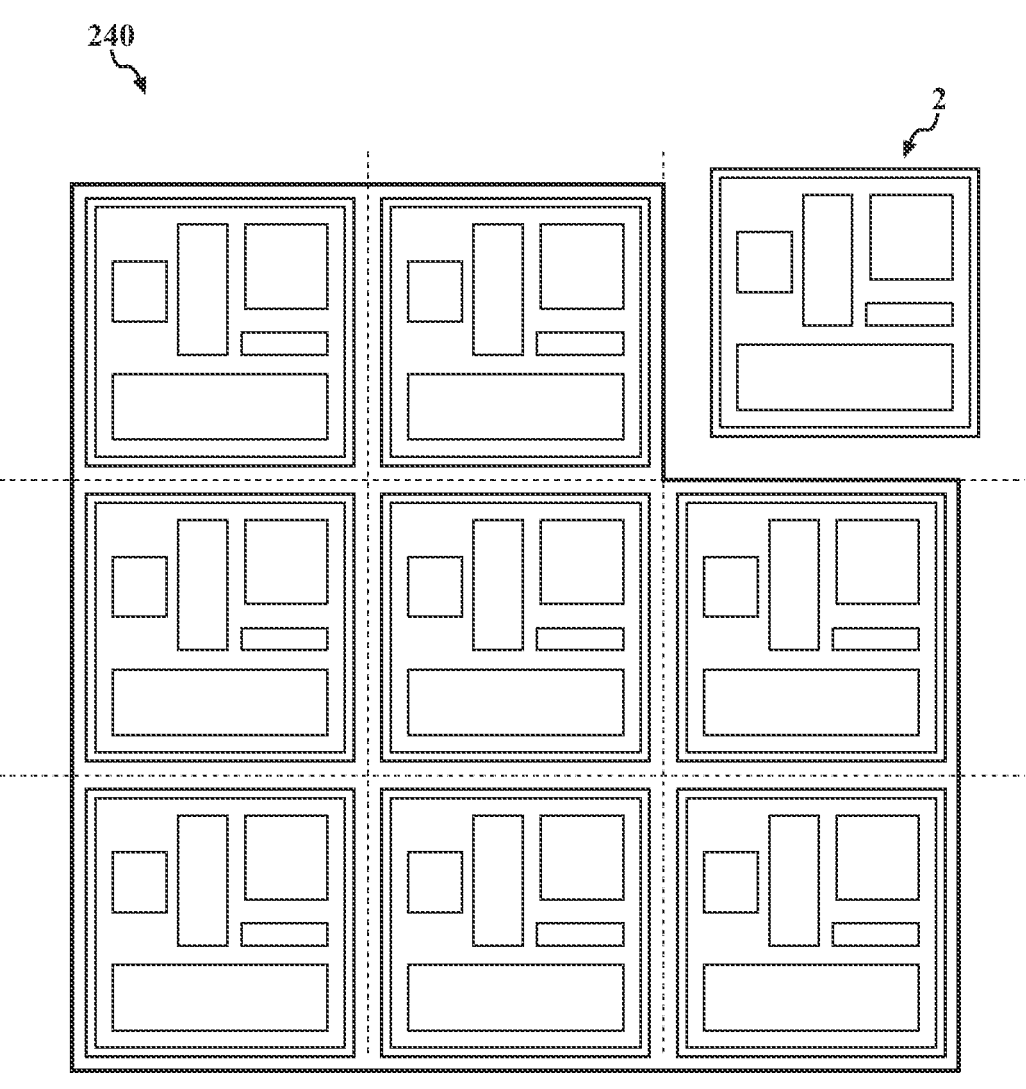
FIG. 3E shows a top view of the highly integrated power electronics embedded PCB—cold plate fabrication panel in FIG. 3D being cut into individual highly integrated power electronics embedded PCB—cold plate assemblies.
Figure 3F:
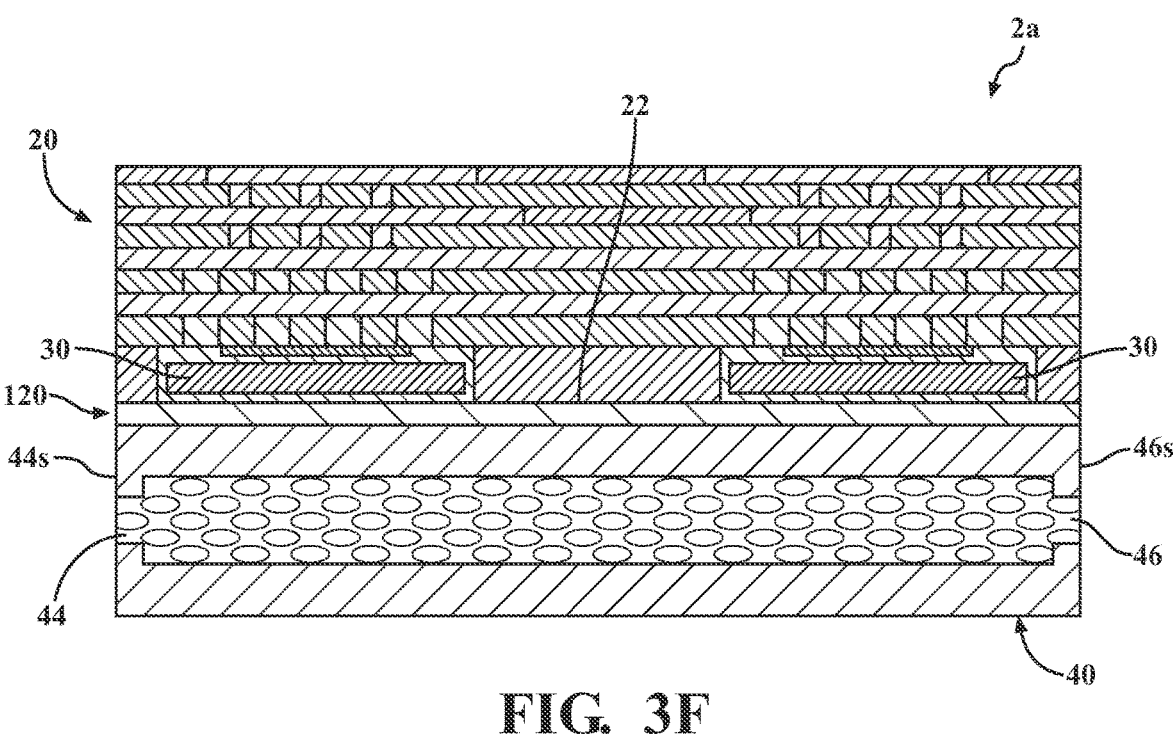
FIG. 3F shows a side cross-sectional view of a highly integrated power electronics embedded PCB—cold plate assembly manufactured from the highly integrated power electronics embedded PCB—cold plate fabrication panel in FIG. 3E.
Figure 3G:
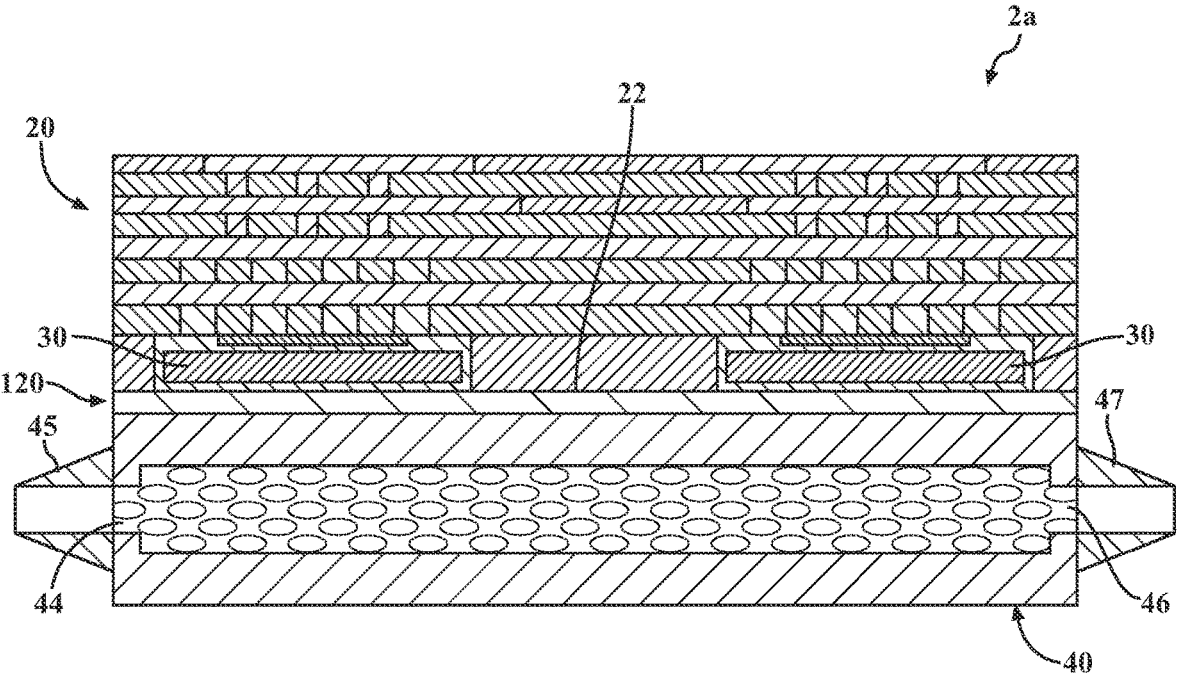
FIG. 3G shows the highly integrated power electronics embedded PCB—cold plate assembly in FIG. 3F with an inlet tube and an outlet tube attached to the cold plate.

FIG. 3E illustrates the power electronics embedded PCB—cold plate fabrication panel 240 being cut into individual highly integrated power electronics embedded PCB—cold plate assemblies 2 and FIG. 3F shows a cross-sectional side view of a highly integrated power electronics embedded PCB—cold plate assembly 2a according to one form of the present disclosure. Particularly, the highly integrated power electronics embedded PCB—cold plate assembly 2a includes two power devices 30 along or aligned with a lower surface 22 of the power electronics embedded PCB 20. Also the inlet 44 and outlet 46 are formed on sidewalls 44s and 46s, respectively, of the cold plate 40, and the inlet tube 45 and the outlet tube 47 are attached to and in fluid communication with the inlet 44 and the outlet 46, respectively, as shown in FIG. 3G.

Figures 3H, 3I:
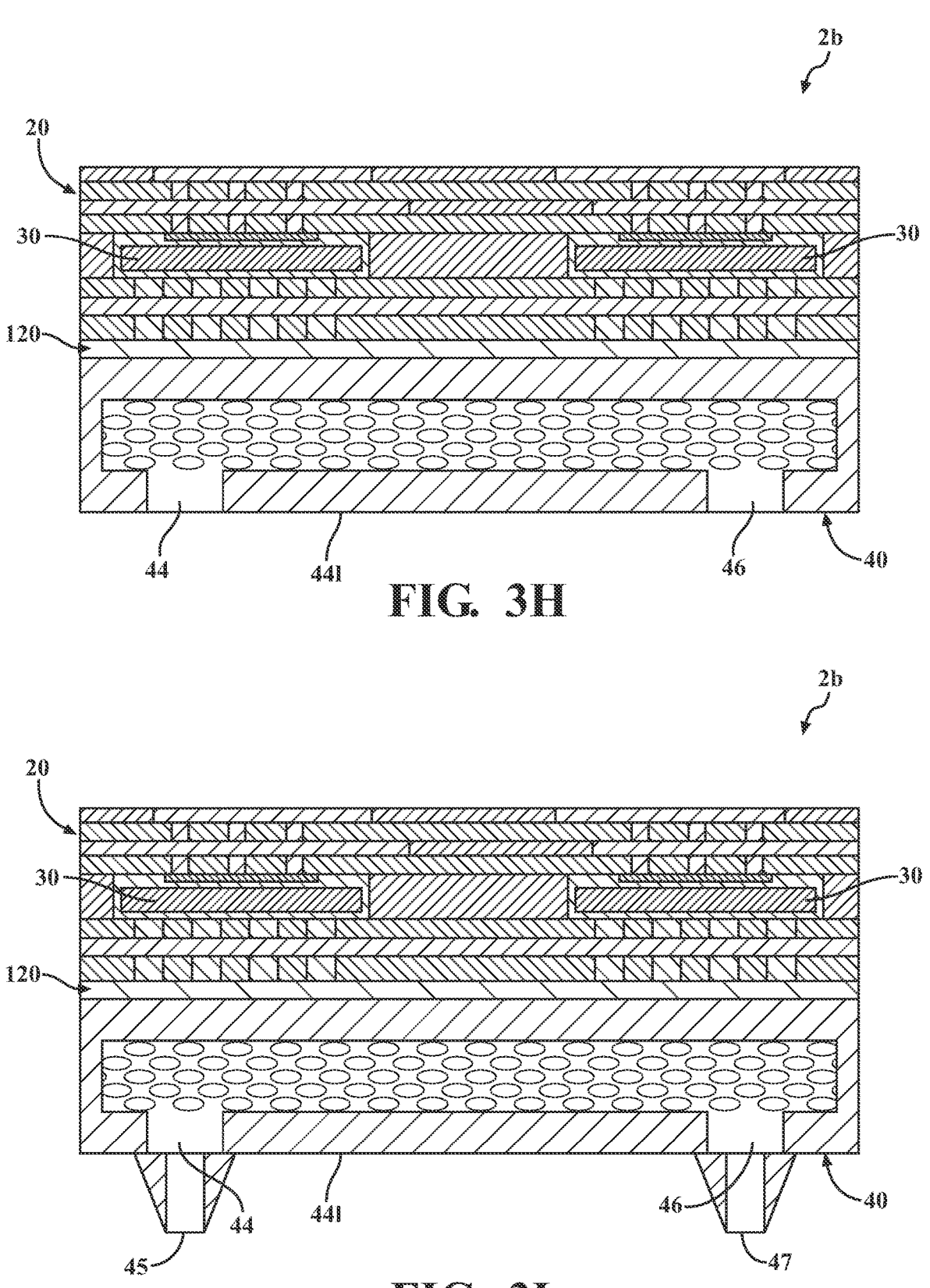
FIG. 3H shows a side cross-sectional view of another highly integrated power electronics embedded PCB—cold plate assembly manufactured from the highly integrated power electronics embedded PCB—cold plate fabrication panel in FIG. 3E.
FIG. 3I shows the highly integrated power electronics embedded PCB—cold plate assembly in FIG. 3H with an inlet tube and an outlet tube attached to the cold plate.

FIG. 3H shows a side cross-sectional view of a highly integrated power electronics embedded PCB—cold plate assembly 2b according to another form of the present disclosure. Particularly, the highly integrated power electronics embedded PCB—cold plate assembly 2b includes two power devices 30 completely embedded within the power electronics embedded PCB 20. Also, the inlet 44 and outlet 46 are formed on a lower wall 44l of the cold plate 40, and the inlet tube 45 and the outlet tube 47 are attached to and in fluid communication with the inlet 44 and the outlet 46, respectively, as shown in FIG. 3I.

Figures 4A, 4B, 4C, 4D:
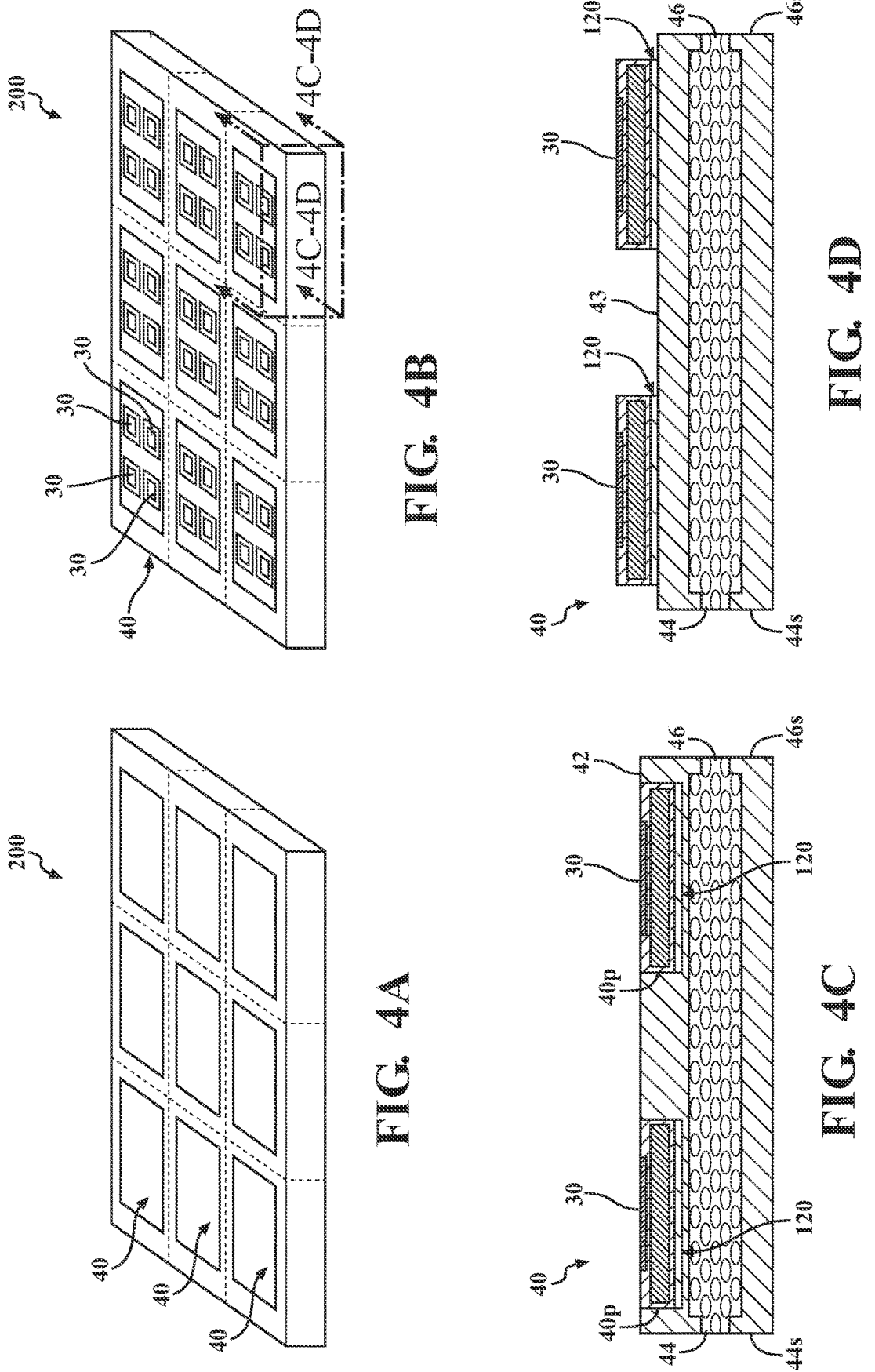
FIG. 4A shows a perspective view of another cold plate fabrication panel according to the teachings of the present disclosure.
FIG. 4B shows a perspective view of the cold plate fabrication panel in FIG. 4A with a plurality of power devices bonded thereto.
FIG. 4C shows a side cross-section view of section 4C-4D in FIG. 4B according to one form of the present disclosure.
FIG. 4D shows a side cross-section view of section 4C-4D in FIG. 4B according to another form of the present disclosure.

Referring now to FIGS. 4A-4E, steps for manufacturing a plurality of highly integrated power electronics embedded PCB—cold plate assemblies 2 according to another form of the present disclosure are shown. Particularly, FIG. 4A illustrates preparing or providing a cold plate fabrication panel 200 from which nine (9) separate cold plates 40 are formed. That is, the cold plate fabrication panel 200 is manufactured to have nine individual cold plates 40 after the cold plate fabrication panel 200 is cut or separated into individual cold plates units. It should be understood that the cold plate fabrication panel 200 can be manufactured to have less than nine or more than nine individual cold plates 40 after the cold plate fabrication panel 200 is cut or separated into individual cold plates units.

However, and unlike the steps or method of manufacturing an integrated power electronics embedded PCB—cold plate fabrication panel 240 discussed above with respect to FIGS. 3A-3D, FIG. 4B illustrates power devices 30 bonded (e.g., laminated) to the cold plate fabrication panel 200 before a multi-layer PCB is bonded thereto. For example, in some variations four (4) power devices 30 are bonded to each cold plate 40, i.e., four power devices 30 are bonded to and in alignment with what will be a cold plate 40 after the cold plate fabrication panel 200 is cut into individual cold plates 40.

Figure 4E:
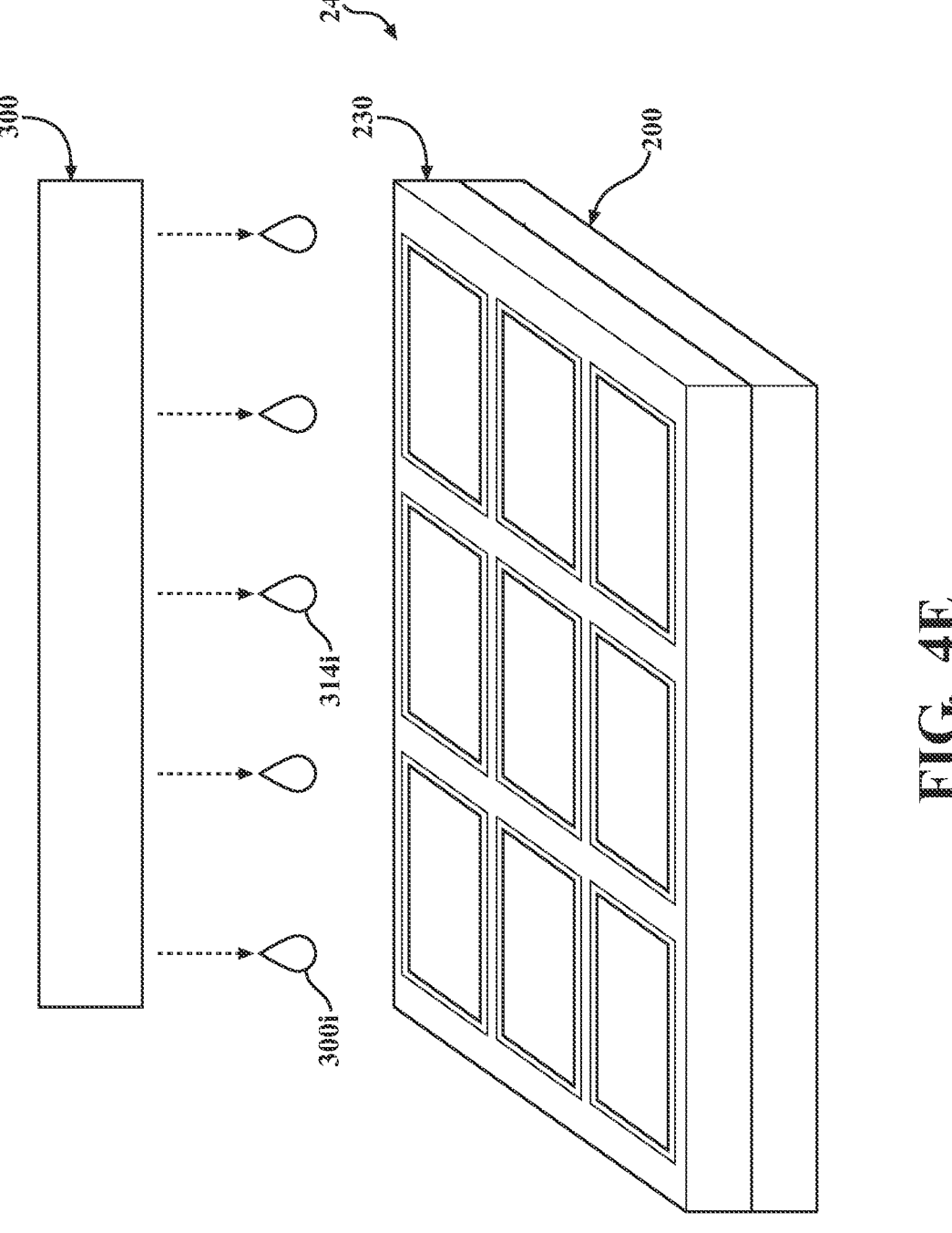
FIG. 4E shows a multi-layer PCB being 3D printed onto the cold plate fabrication panel with the plurality of power devices bonded thereto in FIG. 4B.

Referring to FIG. 4C, in some variations, recesses or pockets 40p or formed or present in the upper surface 42 of the cold plate 40, the power devices 30 are embedded or seated in the pockets 40p, and the power devices seated in the pockets 40p are bonded to the cold plate fabrication panel 200 via a bonding interface 120. In other variations, and with reference to FIG. 4D, the power devices 30 are bonded to a generally planar upper surface 42 (+z direction) of the upper wall 44u via a bonding interface 120. And for either variation disclosed in FIG. 4C or FIG. 4D, FIG. 4E illustrates a 3D printer 300, with dielectric ink 300i and conductive ink 314i, 3D-printing a multi-layer PCB fabrication panel 230 onto the cold plate fabrication panel 200 with the power devices 30 bonded thereto such that a power electronics embedded PCB—cold plate fabrication panel 240 is formed.

Referring now to FIG. 5, one method 50 for manufacturing a plurality of highly integrated power electronics embedded PCB—cold plate units or assemblies includes preparing a cold plate fabrication panel at 500 and assembling an integrated power electronics embedded PCB fabrication panel onto the cold plate fabrication panel at 510 such that an integrated power electronics embedded PCB—cold plate fabrication panel is formed. In some variations, the integrated power electronics embedded PCB fabrication panel is assembled onto the cold fabrication panel by bonding the integrated power electronics embedded PCB fabrication panel to the cold plate fabrication panel via a CVD dielectric layer bonding interface. In other variations, the integrated power electronics embedded PCB fabrication panel is assembled onto the cold fabrication panel by bonding the integrated power electronics embedded PCB fabrication panel to the cold plate fabrication panel via a LTR dielectric layer bonding interface. And in at least one variation, the integrated power electronics embedded PCB fabrication panel is assembled onto the cold fabrication panel by first bonding a plurality of power devices onto the cold plate fabrication panel and then 3D printing a multi-layer PCB fabrication panel onto the cold plate fabrication panel with the plurality of power devices bonded thereto.

Still referring to FIG. 5, the method 50 includes cutting the integrated power electronics embedded PCB—cold plate fabrication panel into a plurality of highly integrated power electronics embedded PCB—cold plate assemblies at 520. In some variations, an inlet and/or an outlet are/is formed in the cold plate of each of the highly integrated power electronics embedded PCB—cold plate assemblies at 520 and an inlet tube and an outlet tube are assembled onto the inlet and outlet, respectively, at 530. In other variations, an inlet and/or an outlet are/is formed in the cold plate of each of the highly integrated power electronics embedded PCB—cold plate assemblies at 530 and an inlet tube and an outlet tube are assembled onto the inlet and outlet, respectively, at 530.

Referring to FIG. 6, another method 60 for manufacturing a plurality of highly integrated power electronics embedded PCB—cold plate units or assemblies includes preparing a cold plate fabrication panel at 600, preparing an integrated power electronics embedded PCB fabrication panel at 610, and bonding the integrated power electronics embedded PCB fabrication panel to the cold plate fabrication panel to from an integrated power electronics embedded PCB—cold plate fabrication panel at 620. In some variations, the integrated power electronics embedded PCB fabrication panel is bonded to the cold fabrication panel via a CVD dielectric layer bonding interface, while in other variations the integrated power electronics embedded PCB fabrication panel is bonded to the cold fabrication panel via a LTR dielectric layer bonding interface. The method 60 also includes cutting the integrated power electronics embedded PCB—cold plate fabrication panel into a plurality of highly integrated power electronics embedded PCB—cold plate assemblies at 630. In some variations, an inlet and/or an outlet are/is formed in the cold plate of each of the highly integrated power electronics embedded PCB—cold plate assemblies at 630 and an inlet tube and an outlet tube are assembled onto the inlet and outlet, respectively, at 640. In other variations, an inlet and/or an outlet are/is formed in the cold plate of each of the highly integrated power electronics embedded PCB—cold plate assemblies at 640 and an inlet tube and an outlet tube are assembled onto the inlet and outlet, respectively, at 640.

Referring to FIG. 7, still another method 70 for manufacturing a plurality of highly integrated power electronics embedded PCB—cold plate units or assemblies includes preparing a cold plate fabrication panel at 700 and bonding a plurality of power devices onto the cold plate fabrication panel at 810. In some variations, the plurality of power devices are nested or seated within a plurality of pockets that are present in the cold plate fabrication, i.e., each of power devices are seated and bonded within a given pocket that is present in a wall of the cold plate fabrication panel. In other variations, the plurality of power devices are bonded to a generally planar surface of the cold plate fabrication panel.

The method 70 proceeds to 720 where a multi-layer PCB fabrication panel is 3D printed onto the cold fabrication panel with the plurality of power devices bonded thereto such that an integrated power electronics embedded PCB—cold plate fabrication is formed. And the integrated power electronics embedded PCB—cold plate fabrication panel is cut into a plurality of highly integrated power electronics embedded PCB—cold plate assemblies at 730. In some variations, an inlet and/or an outlet are/is formed in the cold plate of each of the highly integrated power electronics embedded PCB—cold plate assemblies at 730 and an inlet tube and an outlet tube are assembled onto the inlet and outlet, respectively, at 740. In other variations, an inlet and/or an outlet are/is formed in the cold plate of each of the highly integrated power electronics embedded PCB—cold plate assemblies at 740 and an inlet tube and an outlet tube are assembled onto the inlet and outlet, respectively, at 740.

The preceding description is merely illustrative in nature and is in no way intended to limit the disclosure, its application, or its uses. Work of the presently named inventors, to the extent it may be described in the background section, as well as aspects of the description that may not otherwise qualify as prior art at the time of filing, are neither expressly nor impliedly admitted as prior art against the present technology.

The block diagram in the figures illustrates the functionality and operation of possible implementations of methods and systems according to various forms or variations. In this regard, each block in the block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for the general organization of topics within the present disclosure and are not intended to limit the disclosure of the technology or any aspect thereof. The recitation of multiple variations or forms having stated features is not intended to exclude other variations or forms having additional features, or other variations or forms incorporating different combinations of the stated features.

As used herein the term "about" when related to numerical values herein refers to known commercial and/or experimental measurement variations or tolerances for the referenced quantity. In some variations, such known commercial and/or experimental measurement tolerances are +/−10% of the measured value, while in other variations such known commercial and/or experimental measurement tolerances are +/−5% of the measured value, while in still other variations such known commercial and/or experimental measurement tolerances are +/−2.5% of the measured value. And in at least one variation, such known commercial and/or experimental measurement tolerances are +/−1% of the measured value.

The terms "a" and "an," as used herein, are defined as one or more than one. The term "plurality." as used herein, is defined as two or more than two. The term "another," as used herein, is defined as at least a second or more. The terms "including" and/or "having." as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC, or ABC).

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that a form or variation can or may comprise certain elements or features does not exclude other forms or variations of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one variation, or various variations means that a particular feature, structure, or characteristic described in connection with a form or variation or particular system is included in at least one variation or form. The appearances of the phrase "in one variation" (or variations thereof) are not necessarily referring to the same variation or form. It should also be understood that the various method steps discussed herein do not have to be conducted in the same order as depicted, and not each method step is required in each variation or form.

The foregoing description of the forms and variations has been provided for purposes of illustration and description. It is not intended to be exhaustive or to limit the disclosure. Individual elements or features of a particular form or variation are generally not limited to that particular form or variation, but, where applicable, are interchangeable and can be used in a selected form or variation, even if not specifically shown or described. The same may also be varied in many ways. Such variations should not be regarded as a departure from the disclosure, and all such modifications are intended to be included within the scope of the disclosure.

What is claimed is:

1. A method comprising:

assembling an integrated power electronics embedded printed circuit board (PCB) fabrication panel onto a cold plate fabrication panel and forming an integrated power electronics embedded PCB-cold plate fabrication panel by laminating the integrated power electronics embedded PCB fabrication panel onto the cold plate fabrication panel; and cutting the integrated power electronics embedded PCB-cold plate fabrication panel into a plurality of highly integrated power electronics embedded PCB-cold plate assemblies such that the plurality of highly integrated power electronics embedded PCB-cold plate assemblies individually include an integrated power electronics embedded PCB attached to and in thermal communication with a cold plate.

2. The method according to claim 1, wherein the cold plate comprises a fluid chamber configured for a cooling fluid to flow therethrough.

3. The method according to claim 2 further comprising forming an inlet and an outlet in the cold plate, wherein the inlet is configured for the cooling fluid to flow into the fluid chamber and the outlet is configured for the cooling fluid to flow out of the fluid chamber.

4. The method according to claim 3, wherein at least one of the inlet and the outlet is formed in a sidewall of the cold plate.

5. The method according to claim 3, wherein at least one of the inlet and the outlet is formed in a lower wall of the cold plate.

6. The method according to claim 3, wherein at least one of a porous material and a plurality of fins is disposed within the fluid chamber of the cold plate.

7. The method according to claim 3 further comprising attaching an inlet tube and an outlet tube to the inlet and the outlet of the cold plate.

8. The method according to claim 1, wherein a bonding interface comprising a low thermal resistance dielectric layer, a CVD dielectric layer, or a ceramic sintered layer is sandwiched between the integrated power electronics embedded PCB fabrication panel and the cold plate fabrication panel.

9. The method according to claim 8, wherein the bonding interface is in direct contact with at least one of the integrated power electronics embedded PCB fabrication panel and the cold plate fabrication panel.

10. The method according to claim 1, wherein assembling the integrated power electronics embedded PCB fabrication panel onto the cold plate fabrication panel comprises bonding a plurality of power devices onto the cold plate fabrication panel.

11. The method according to claim 10, wherein the cold plate fabrication panel comprises a plurality of pockets and the plurality of power devices are seated in the plurality of pockets.

12. The method according to claim 10, wherein the plurality of power devices are bonded to a generally planar upper surface of the cold plate fabrication panel.

13. A method comprising:

assembling an integrated power electronics embedded printed circuit board (PCB) fabrication panel onto a cold plate fabrication panel and forming an integrated power electronics embedded PCB-cold plate fabrication panel; and cutting the integrated power electronics embedded PCB-cold plate fabrication panel into a plurality of highly integrated power electronics embedded PCB-cold plate assemblies such that the plurality of highly integrated power electronics embedded PCB-cold plate assemblies individually include an integrated power electronics embedded PCB attached to and in thermal communication with a cold plate comprising a fluid chamber configured for a cooling fluid to flow therethrough.

14. The method according to claim 13 further comprising forming an inlet and an outlet in the cold plate, wherein the inlet is configured for the cooling fluid to flow into the fluid chamber and the outlet is configured for the cooling fluid to flow out of the fluid chamber.

15. The method according to claim 14, wherein at least one of the inlet and the outlet is formed in a sidewall of the cold plate.

16. The method according to claim 14, wherein at least one of the inlet and the outlet is formed in a lower wall of the cold plate.

17. The method according to claim 13, wherein assembling the integrated power electronics embedded PCB fabrication panel onto the cold plate fabrication panel comprises one of:

laminating the integrated power electronics embedded PCB fabrication panel onto the cold plate fabrication panel; and 3D printing a multi-layer PCB fabrication panel onto the cold plate fabrication panel with a plurality of power devices bonded thereto.

18. A method comprising:

assembling an integrated power electronics embedded printed circuit board (PCB) fabrication panel onto a cold plate fabrication panel and forming an integrated power electronics embedded PCB-cold plate fabrication panel via laminating an integrated power electronics embedded PCB onto a cold plate fabrication panel; and cutting the integrated power electronics embedded PCB-cold plate fabrication panel into a plurality of highly integrated power electronics embedded PCB-cold plate assemblies such that the plurality of highly integrated power electronics embedded PCB-cold plate assemblies individually include an integrated power electronics embedded PCB attached to and in thermal communication with a cold plate comprising a fluid chamber configured for a cooling fluid to flow therethrough.

19. The method according to claim 18, wherein the integrated power electronics embedded PCB is laminated onto the cold plate fabrication panel via a bonding interface comprising a CVD dielectric layer, a low thermal resistance dielectric layer, or a ceramic sintered layer.

20. The method according to claim 18 further comprising forming an inlet and an outlet in the cold plate, wherein the inlet is configured for the cooling fluid to flow into the fluid chamber and the outlet is configured for the cooling fluid to flow out of the fluid chamber, and at least one of the inlet and the outlet is formed in a sidewall of the cold plate.

\* \* \* \* \*